(12) United States Patent
Liu et al.

(10) Patent No.: US 9,865,693 B1
(45) Date of Patent: Jan. 9, 2018

(54) SEMICONDUCTOR MEMORY CELL, SEMICONDUCTOR MEMORY DEVICE, AND METHOD OF MANUFACTURING SEMICONDUCTOR MEMORY DEVICE

(71) Applicant: UNITED MICROELECTRONICS CORPORATION, Hsinchu (TW)

(72) Inventors: Weichang Liu, Singapore (SG); Zhen Chen, Singapore (SG); Shen-De Wang, Zhudong Township (TW); Wang Xiang, Singapore (SG); Wei Ta, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/227,986

(22) Filed: Aug. 4, 2016

(51) Int. Cl.
| | | |
|---|---|---|
| H01L 29/66 | (2006.01) |
| H01L 29/423 | (2006.01) |
| H01L 29/792 | (2006.01) |
| H01L 29/06 | (2006.01) |
| H01L 27/11568 | (2017.01) |

(52) U.S. Cl.
CPC .. H01L 29/42344 (2013.01); H01L 27/11568 (2013.01); H01L 29/0653 (2013.01); H01L 29/66833 (2013.01); H01L 29/792 (2013.01)

(58) Field of Classification Search
CPC .................................................. H01L 29/6656
See application file for complete search history.

(56) References Cited

U.S. PATENT DOCUMENTS

| | | | | |
|---|---|---|---|---|
| 5,824,584 A | * | 10/1998 | Chen ..................... | H01L 27/105 257/E21.645 |
| 6,414,350 B1 | * | 7/2002 | Hsieh .................... | H01L 27/115 257/314 |
| 8,575,683 B1 | * | 11/2013 | Shih .................. | H01L 21/28273 257/306 |
| 9,589,970 B1 | * | 3/2017 | Tseng ................ | H01L 27/11206 |
| 2004/0227180 A1 | * | 11/2004 | Huang .............. | H01L 21/28282 257/324 |
| 2004/0256657 A1 | * | 12/2004 | Hung ................... | H01L 27/115 257/315 |
| 2007/0096202 A1 | * | 5/2007 | Kang .................... | H01L 21/764 257/324 |
| 2007/0102775 A1 | * | 5/2007 | Kwon ................. | H01L 29/4983 257/411 |
| 2014/0353739 A1 | * | 12/2014 | Lee ................... | H01L 29/66833 257/326 |

(Continued)

Primary Examiner — Thao P Le
(74) Attorney, Agent, or Firm — Ding Yu Tan

(57) ABSTRACT

A semiconductor memory device and a semiconductor memory cell thereof are provided. The semiconductor memory device includes a plurality of semiconductor memory cells and an electric isolating structure. Each semiconductor memory cell includes a substrate, a first gate, a second gate, a first gate dielectric layer, a second gate dielectric layer, and a first spacing film. The first gate and the second gate are formed on the substrate. The first gate dielectric layer is between the first gate and the substrate, whereas the second gate dielectric layer is between the second gate and the substrate. The first spacing film having a side and a top edge is between the first gate and the second gate. The second gate covers the side and the top edge. Additionally, a method of manufacturing the semiconductor memory device is also provided.

14 Claims, 5 Drawing Sheets

(56) References Cited

U.S. PATENT DOCUMENTS

| | | | |
|---|---|---|---|
| 2015/0372121 A1* | 12/2015 | Chen | H01L 29/66825 257/320 |
| 2016/0064394 A1* | 3/2016 | Chu | H01L 29/7883 257/321 |
| 2016/0148944 A1* | 5/2016 | Yu | H01L 27/11536 438/258 |

* cited by examiner

US 9,865,693 B1

SEMICONDUCTOR MEMORY CELL, SEMICONDUCTOR MEMORY DEVICE, AND METHOD OF MANUFACTURING SEMICONDUCTOR MEMORY DEVICE

FIELD OF THE INVENTION

The present invention relates to a semiconductor device and a method of manufacturing the same, and more particularly to a semiconductor memory device, a semiconductor memory cell thereof, and a method of manufacturing the semiconductor memory device.

BACKGROUND OF THE INVENTION

Flash memories are popular in modern societies. A conventional flash memory is similar to a CMOS (Complementary Metal-Oxide-Semiconductor) transistor, in which the conventional flash memory includes two gates (also called "gate electrodes") and a spacing film sandwiched between the gates. The spacing film is made of dielectric material and has to electrically isolate both gates from each other to prevent causing a short circuit between the gates, so that the spacing film prefers to have high breakdown voltage. Hence, the spacing film sandwiched between two gates is an important part of the flash memory.

SUMMARY OF THE INVENTION

The present invention provides a semiconductor memory cell including a substrate, a first gate, a second gate, a first gate dielectric layer, a second gate dielectric layer, and a first spacing film. The substrate has a source and a drain. The first gate is formed on the substrate. The second gate is formed on the substrate. Both the first gate and the second gate are between the source and the drain. The first gate dielectric layer is between the first gate and the substrate, whereas the second gate dielectric layer is between the second gate and the substrate. The first spacing film is between the first gate and the second gate, and the first spacing film has a sidewall and a top edge. The second gate covers the sidewall and the top edge.

The present invention also provides a semiconductor memory device including the semiconductor memory cells and an electric isolating structure formed in the substrate for isolating the semiconductor memory cells from each other.

The present invention also provides a method of manufacturing the semiconductor memory device. In the method, a substrate is provided. Then, a plurality of gate structures and a plurality of dielectric caps are formed, wherein the gate structures are formed on the substrate and each comprise a first gate and a first gate dielectric layer between the first gate and the substrate, and the dielectric caps are formed atop the gate structures respectively. Next, a first dielectric layer and a second dielectric layer are formed. The first dielectric layer covers the dielectric caps and a plurality of sidewalls of the gate structures. The second dielectric layer covers the first dielectric layer. Then, partially remove the second dielectric layer to reveal a plurality of top parts of the first dielectric layer and to form a plurality of first spacing films. Then, a plurality of second gates is formed on the substrate. The second gates cover and contact the first dielectric layer and a top edge of the first spacing film. Next, the dielectric caps are removed to reveal the first gates. Then, drains and sources are formed in the substrate.

Based on the above, since the second gates cover the top edges of the first spacing films, the first spacing films can be protected by the second gates. Therefore, the breakdown voltage between the two gates (e.g. first gate and second gate) can be kept or increased

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF EMBODIMENTS

The present invention will now be described more specifically with reference to the following embodiments. It is to be noted that the following descriptions of embodiments of this invention are presented herein for purpose of illustration and description only. It is not intended to be exhaustive or to be limited to the precise form disclosed.

Figure 1A:
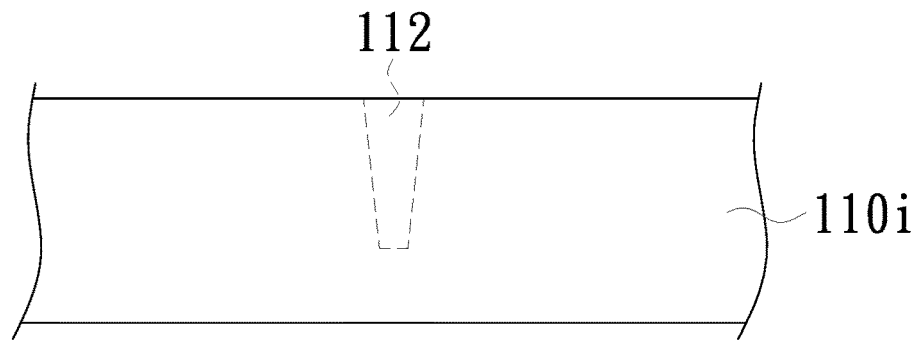
FIG. 1A to FIG. 1I are cross-sectional views of a method of manufacturing a semiconductor memory device in accordance with an embodiment of the present invention.

FIG. 1A to FIG. 1H illustrate a method of manufacturing a semiconductor memory device in accordance with an embodiment of the present invention. Referring to FIG. 1A, in the method, first, provide a substrate 110$i$, which may be a wafer. Then, an electric isolating structure 112 is formed in the substrate 110$i$. The electric isolating structure 112 may be a shallow trench isolation (STI), a field oxide (FOX), or a doping region.

Figure 1B:
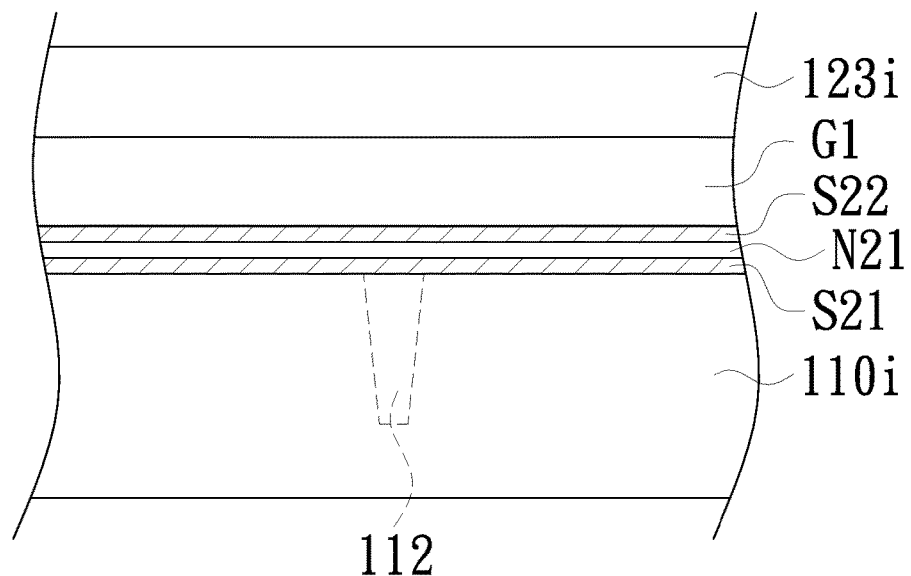
Figure 1C:
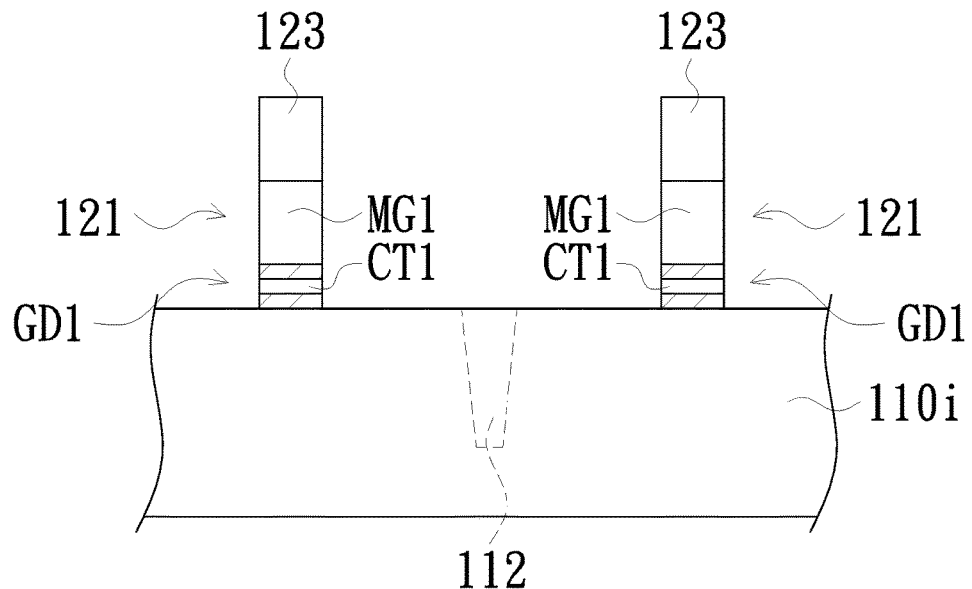

Referring to FIG. 1B and FIG. 1C, after the electric isolating structure 112 is completed, a plurality of gate structures 121 and a plurality of dielectric caps 123 are formed. The gate structures 121 are formed on the substrate 110$i$, and the dielectric caps 123 are formed atop the gate structures 121, respectively. The gate structures 121 and the dielectric caps 123 can be formed by thin-film deposition and photolithography.

In the formation of the gate structures 121 and the dielectric caps 123, multiple films are formed on the substrate 110$i$ first, and the multiple films includes a plurality of dielectric films S21, N21, S22, 123$i$, and a semiconductor layer G1. The dielectric films S21, N21, and S22 are formed on the substrate 110$i$ in sequence, where the dielectric film N21 is sandwich between the dielectric films S21 and S22, and the dielectric film S21 is in contact with the substrate 110$i$. The semiconductor layer G1 is formed between the dielectric films S22 and 123$i$, as shown in FIG. 1B.

The dielectric films S21 and S22 may be silicon oxide films (e.g. $SiO_2$), whereas the dielectric films N21 and 123$i$ may be silicon nitride films (e.g. $Si_3N_4$). The semiconductor layer G1 may be made of poly silicon. The dielectric films S21, N21, S22, 123$i$ and the semiconductor layer G1 can be formed by chemical vapor deposition (CVD). Afterward, photolithography is performed to remove parts of the above-mentioned multiple film and to form the gate structures 121 and the dielectric caps 123.

The rest of the dielectric films S21, N21, S22 and the semiconductor layer G1 become the gate structures 121, and the rest of the dielectric film 123$i$ becomes the dielectric caps 123. The gate structures 121 each includes a first gate MG1 and a first gate dielectric layer GD1 between the first gate MG1 and the substrate 110$i$. The first gate MG1 is formed from the semiconductor layer G1, and the first gate dielectric layer GD1 is formed from the dielectric films S21, N21, S22.

In addition, the first gate dielectric layer GD1 includes a charge-trap layer CT1, which is formed from the dielectric film N21. That is, the charge-trap layer CT1 is a silicon nitride film. Moreover, the substrate 110*i*, the first gate dielectric layer GD1, and the first gate MG1 can form a SONOS structure when the charge-trap layer CT1 is silicon nitride film; the dielectric films S21 and S22 are silicon oxide films; and the first gate MG1 is made of poly silicon.

Figure 1D:
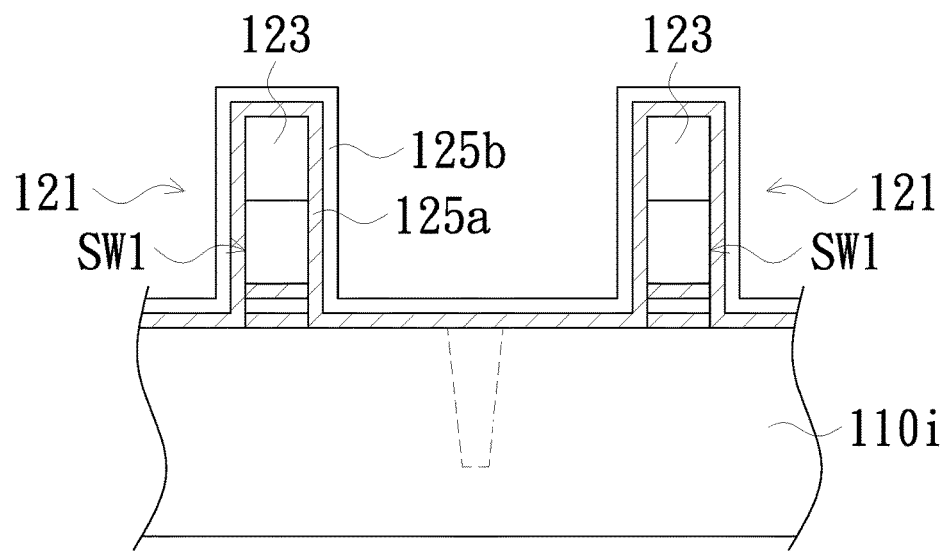

Referring to FIG. 1D, a first dielectric layer 125*a* and a second dielectric layer 125*b* are formed. The first dielectric layer 125*a* covers the dielectric caps 123 and a plurality of sidewalls SW1 of the gate structures 121, whereas the second dielectric layer 125*b* covers the first dielectric layer 125*a*. That is, the first dielectric layer 125*a* is formed between the second dielectric layer 125*b* and the substrate 110*i*.

The first dielectric layer 125*a* and the second dielectric layer 125*b* also can be formed by thin-film deposition, such as CVD. Both the first dielectric layer 125*a* and the second dielectric layer 125*b* which are formed by CVD can conformally cover the gate structures 121 and the dielectric caps 123. Moreover, the first dielectric layer 125*a* may be a silicon oxide film, and the second dielectric layer 125*b* may be a silicon nitride film. In other words, the materials (e.g. silicon oxide and silicon nitride) of both the first dielectric layer 125*a* and the second dielectric layer 125*b* are different.

Figure 1E:
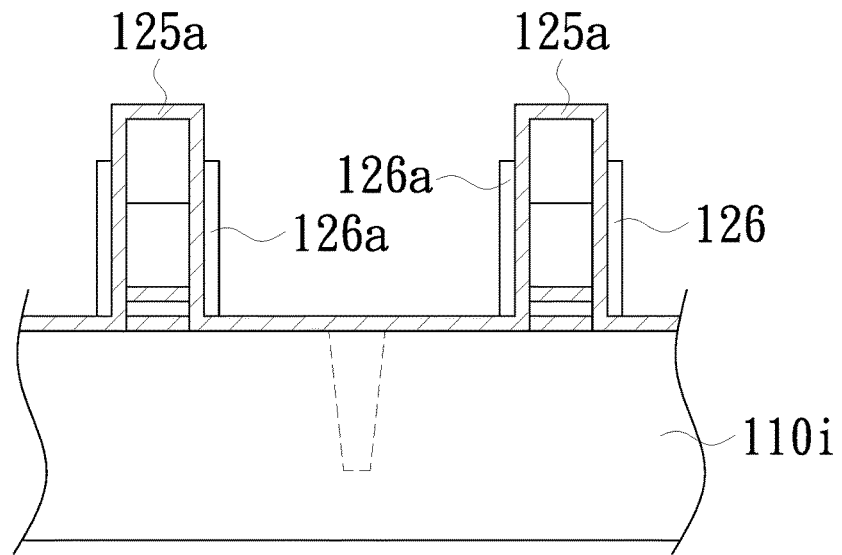

Referring to FIG. 1D and FIG. 1E, then, the second dielectric layer 125*b* is partially removed to reveal a plurality of top parts of the first dielectric layer 125*a* and to form a plurality of first spacing films 126*a* (as shown in FIG. 1E). Partially removal of the second dielectric layer 125*b* includes performing a plasma etching. That is, the part of the second dielectric layer 125*b* can be removed by plasma.

The etching rate of the second dielectric layer 125*b* is different from the etching rate of the first dielectric layer 125*a* because the materials of both the first dielectric layer 125*a* and the second dielectric layer 125*b* are different. During the plasma etching, the etching rate of the second dielectric layer 125*b* is higher than the etching rate of the first dielectric layer 125*a*, so that the removed part of the second dielectric layer 125*b* is more than the removed part of the first dielectric layer 125*a*. Even, the whole first dielectric layer 125*a* can be almost remained after the plasma etching according to the embodiment illustrated in FIG. 1E. After the part of the second dielectric layer 125*b* is removed, the rest of the second dielectric layer 126 forms the first spacing films 126*a*.

Figure 1F:
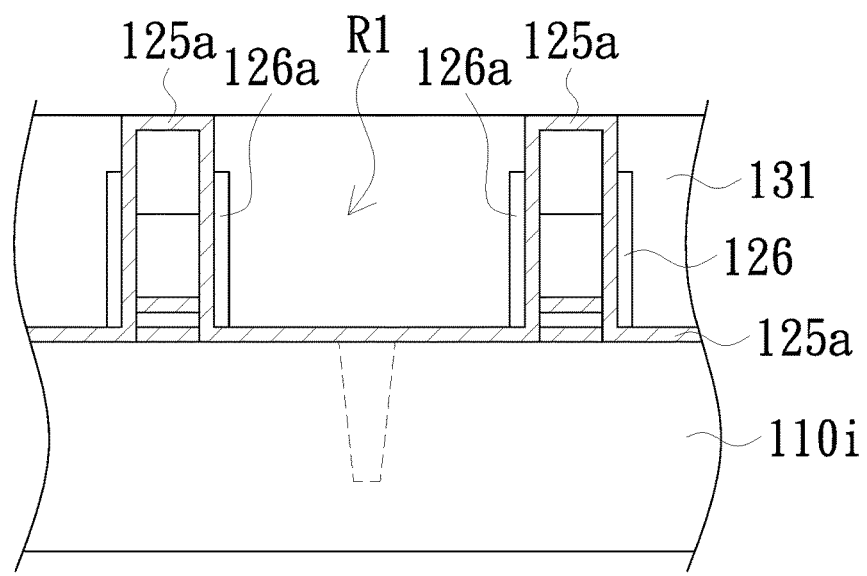
Figure 1G:
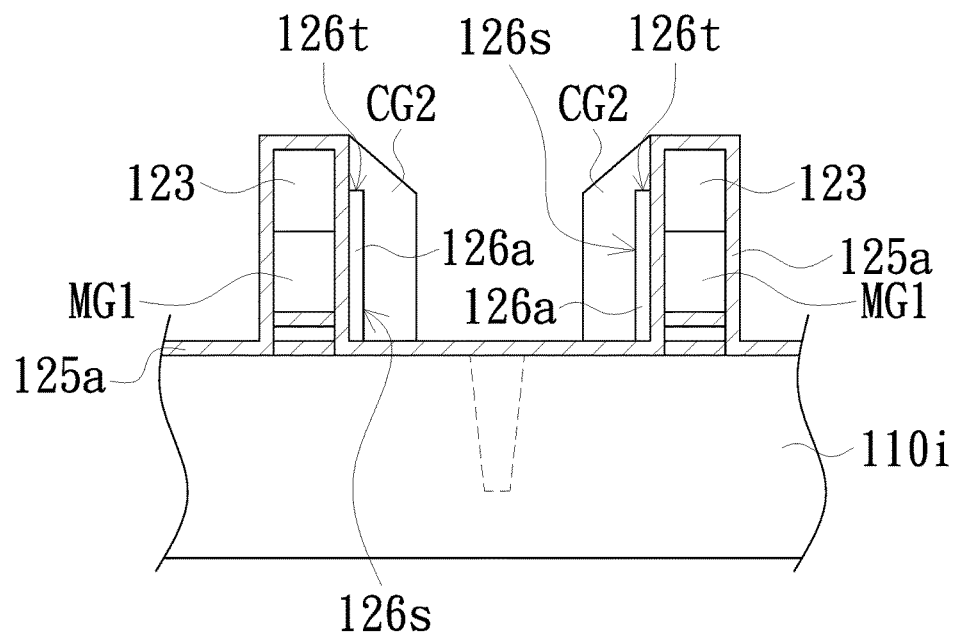

Referring to FIG. 1F and FIG. 1G, subsequently, a plurality of second gates CG2 are formed on the substrate 110*i*. The second gates CG2 can be formed by thin-film deposition. Specifically, in the formation of the second gates CG2, a semiconductor film 131 is formed on the substrate 110*i* at first, in which the semiconductor film 131 can be formed by CVD, and the materials of both the semiconductor layer G1 (referring to FIG. 1B) and the semiconductor film 131 may be the same. In addition, the (completed) semiconductor film 131 may fill a depression R1 and cover two adjacent first spacing films 126*a*, where the depression R1 is defined by the two adjacent first spacing films 126*a* and the substrate 110*i*.

After the semiconductor film 131 is completed, the semiconductor film 131 is partially removed to form the second gates CG2. The second gate CG2 covers and contacts the first dielectric layer 125*a* and a top edge 126*t* of the first spacing film 126*a*. Accordingly, each first spacing film 126*a* is sandwiched between the second gate CG2 and the first dielectric layer 125*a*, and covered by the second gate CG2 and the first dielectric layer 125*a*, as shown in FIG. 1G. The removal of the part of the semiconductor film 131 and the formation of the second gates CG2 may be performed by self aligned etching, and the part of the semiconductor film 131 can be removed by dry etching, such as plasma etching.

Since the second gates CG2 can be formed by dry etching (e.g. plasma etching), a top of each second gate CG2 may form an inclined surface, where one inclined surface is opposite to and faces to the other inclined surface, as illustrated in FIG. 1G. In addition, except for the first spacing films 126*a*, the rest of the second dielectric layer 126 may be removed by etching (e.g. dry etching or wet etching) after the second gates CG2 are completed.

Figure 1H:
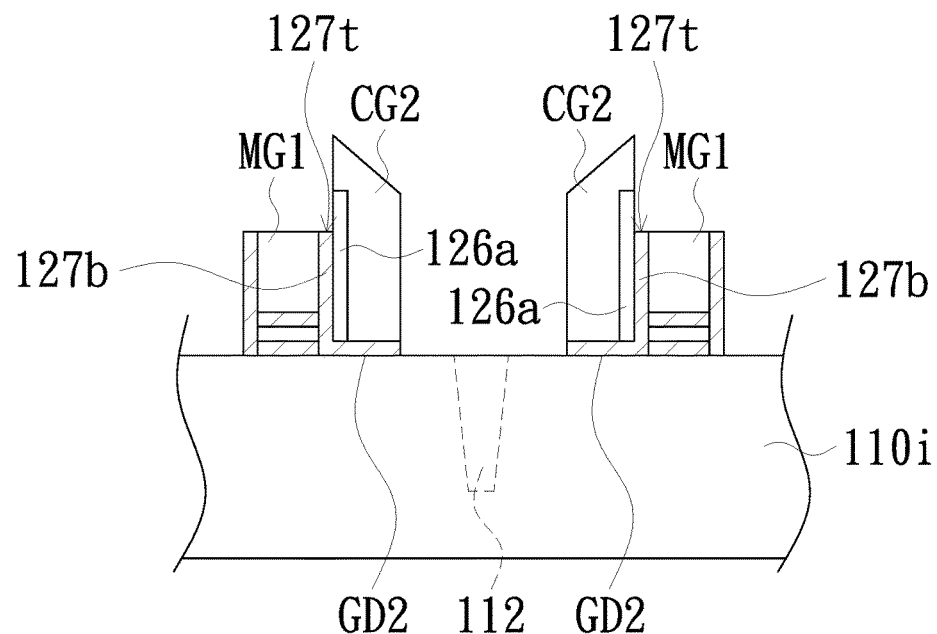

Referring to FIG. 1G and FIG. 1H, afterwards, the dielectric caps 123 are removed to reveal the first gates MG1, in which the removal of the dielectric caps 123 can include performing a wet etching. Because phosphoric acid ($H_3PO_4$) can dissolve silicon nitride, the wet etching can use phosphoric acid as etchant when the material of the dielectric caps 123 is silicon nitride. However, phosphoric acid basically can't dissolve silicon and silicon oxide, so that the first dielectric layer 125*a* (e.g. silicon oxide) and the first gate MG1 (e.g. poly silicon) can be remained.

The second gates CG2 cover both the top edges 126*t* and sidewalls 126*s* of the first spacing films 126*a*, and each first spacing film 126*a* is sandwiched between the second gate CG2 and the first dielectric layer 125*a* and covered by the second gate CG2 and the first dielectric layer 125*a*, so that the second gates CG2 (e.g. poly silicon) and the second dielectric layer 125*b* (e.g. silicon oxide) can protect the first spacing films 126*a* from phosphoric acid, thereby remaining entire first spacing films 126*a*.

In addition, before the dielectric caps 123 are removed, the first dielectric layer 125*a* can be partially removed to reveal the dielectric caps 123 and the substrate 110*i* by etching, such as dry etching (e.g. plasma etching). Therefore, the dielectric caps 123 can be in contact with etchant (e.g. phosphoric acid) and be removed.

Moreover, after the first dielectric layer 125*a* is partially removed, the rest of the first dielectric layer 125*a* forms a plurality of second spacing films 127*b* and a plurality of second gate dielectric layers GD2. Each second spacing film 127*b* is between the first spacing film 126*a* and the first gate MG1, whereas each second gate dielectric layer GD2 is between the second gate CG2 and the substrate 110*i*. Furthermore, the first gate MG1 and the second gate CG2 do not cover a top edge 127*t* of the second spacing film 127*b*.

Figure 1I:
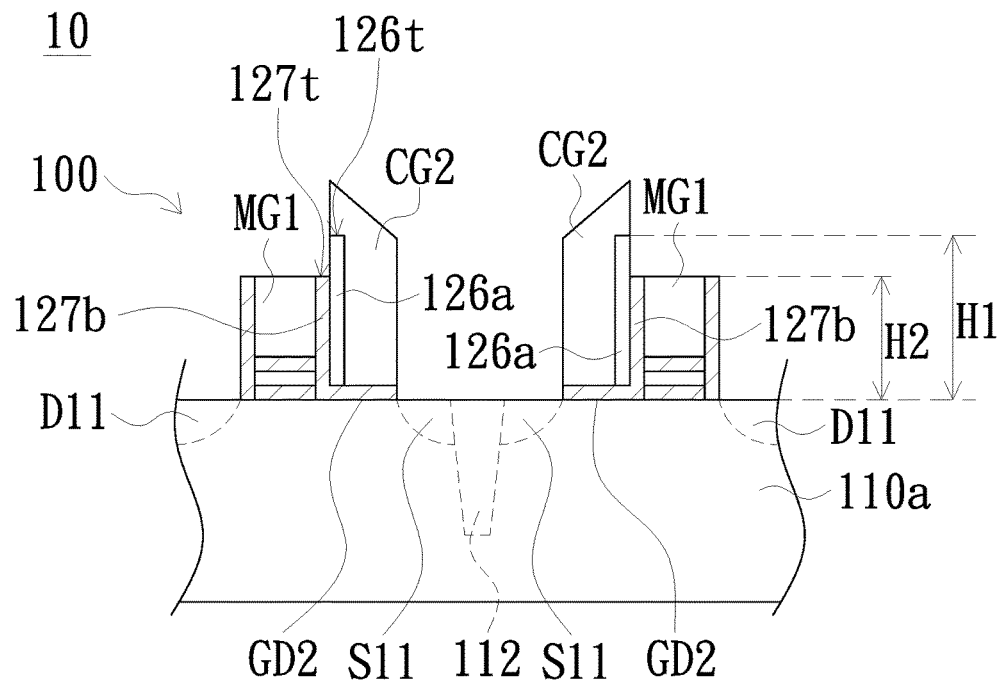
Figure 2:
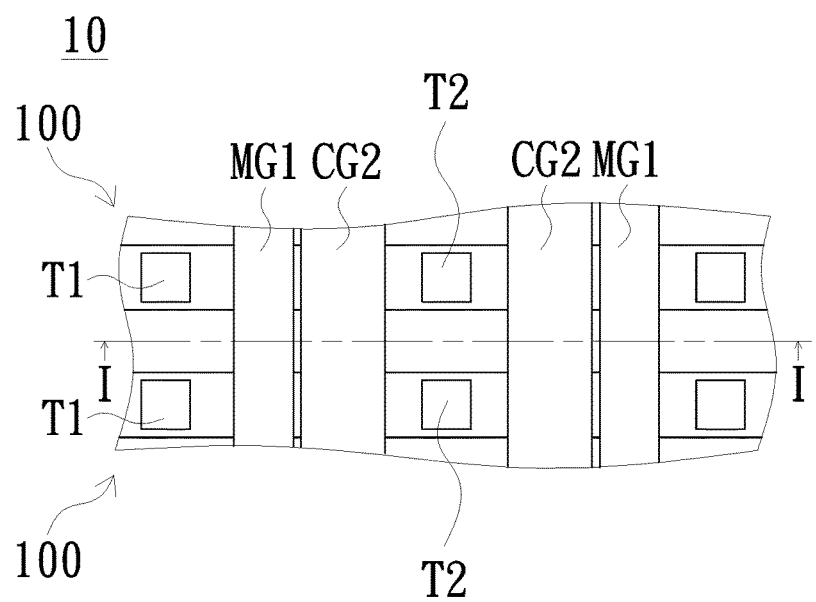
FIG. 2 is a plan view of the semiconductor memory device in FIG. 1I.

Refer to FIG. 1I and FIG. 2, where FIG 1I. is the cross-sectional view taken along the line I-I in FIG. 2. After the first gates MG1 are revealed by removing the dielectric caps 123, a plurality of drains D11 and a plurality of sources S11 are formed by doping. The substrate 110*i* becomes a substrate 110*a* after doping, so that the substrate 110*a* has the drains D11 and the sources S11. That is, the drains D11 and the sources S11 are formed in the substrate 110*a*. In addition, a plurality of contacts T1 and contacts T2 can be formed on the drains D11 and the sources S11, respectively, for electric connection.

After the drains D11 and the sources S11 are formed, a semiconductor memory device 10 including a plurality of semiconductor memory cells 100 and the electric isolating structure 112 is basically completed. Each of the semiconductor memory cells 100 includes the substrate 110*a*, the first gate MG1, the second gate CG2, the first gate dielectric layer GD1, the second gate dielectric layer GD2, the first spacing film 126a, and the second spacing film 127b, in which the first gate MG1 is a memory gate, and the second gate CG2 is a select gate. Moreover, the substrate 110a, the first gate dielectric layer GD1, and the first gate MG1 can form a SONGS structure.

In one semiconductor memory cell 100, the first gate MG1 and the second gate CG2 are both formed on the substrate 110a, and between the drain D11 and the source S11. The first gate dielectric layer GD1 is disposed between the first gate MG1 and the substrate 110a, whereas the second gate dielectric layer GD2 is disposed between the second gate CG2 and the substrate 110a. The first spacing film 126a is disposed between the first gate MG1 and the second gate CG2, where the second gate CG2 covers the sidewall 126s and the top edge 126t. In addition, a level H1 of the top edge 126t relative to the substrate 110a is higher than a level H2 of the top edge 127t relative to the substrate 110a.

Based on the above, since the second gates cover the top edges of the first spacing films, the first spacing films can be protected by the second gates during manufacturing process. Therefore, the breakdown voltage between the two gates (e.g. first gate and second gate) can be kept or increased.

While the invention has been described in terms of what is presently considered to be the most practical and embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor memory cell comprising:
   a substrate having a source and a drain;
   a first gate formed on the substrate;
   a second gate formed on the substrate, wherein both the first gate and the second gate are between the source and the drain;
   a first gate dielectric layer between the first gate and the substrate;
   a second gate dielectric layer between the second gate and the substrate; and
   a first spacing film between the first gate and the second gate, and having a sidewall and a top edge, wherein the second gate covers the sidewall and the top edge of the first spacing film, and the first spacing film does not cover a top of the first gate.

2. The semiconductor memory cell according to claim 1, wherein the first gate is a memory gate and the second gate is a select gate.

3. The semiconductor memory cell according to claim 1, wherein the first gate dielectric layer includes a charge-trap layer.

4. The semiconductor memory cell according to claim 1, wherein the substrate, the first gate dielectric layer, and the first gate form a SONOS structure.

5. The semiconductor memory cell according to claim 1, further comprising a second spacing film between the first spacing film and the first gate.

6. The semiconductor memory cell according to claim 5, wherein the first gate and the second gate do not cover a top edge of the second spacing film.

7. The semiconductor memory cell according to claim 5, wherein a level of the top edge of the first spacing film relative to the substrate is higher than a level of the top edge of the second spacing film relative to the substrate.

8. A semiconductor memory device comprising:
   a plurality of semiconductor memory cells, each comprising:
      a substrate having a source and a drain;
      a first gate formed on the substrate;
      a second gate formed on the substrate, wherein both the first gate and the second gate are between the source and the drain;
      a first gate dielectric layer between the first gate and the substrate;
      a second gate dielectric layer between the second gate and the substrate; and
      a first spacing film between the first gate and the second gate, and having a sidewall and a top edge, wherein the second gate covers the sidewall and the top edge of the first spacing film, and the first spacing film does not cover a top of the first gate; and
   an electric isolating structure formed in the substrate for isolating the semiconductor memory cells from each other.

9. The semiconductor memory device according to claim 8, wherein the first gate is a memory gate and the second gate is a select gate.

10. The semiconductor memory device according to claim 8, wherein the first gate dielectric layer includes a charge-trap layer.

11. The semiconductor memory device according to claim 8, wherein the substrate, the first gate dielectric layer, and the first gate form a SONOS structure.

12. The semiconductor memory device according to claim 8, wherein the semiconductor memory cell further comprises a second spacing film between the first spacing film and the first gate.

13. The semiconductor memory device according to claim 12, wherein both the first gate and the second gate do not cover a top of the second spacing film.

14. The semiconductor memory device according to claim 12, wherein a level of the top edge of the first spacing film relative to the substrate is higher than a level of the top edge of the second spacing film relative to the substrate.

* * * * *